(12) United States Patent
Denk et al.

(10) Patent No.: US 11,246,244 B2
(45) Date of Patent: Feb. 8, 2022

(54) POWER ELECTRONICS ASSEMBLY

(71) Applicant: ZF Friedrichshafen AG, Friedrichshafen (DE)

(72) Inventors: Marco Denk, Memmelsdorf (DE); Johannes Hager, Marktleugast (DE); Michael Sperber, Bayreuth (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 0 days.

(21) Appl. No.: 16/969,877

(22) PCT Filed: Feb. 5, 2019

(86) PCT No.: PCT/EP2019/052708
§ 371 (c)(1),
(2) Date: Aug. 13, 2020

(87) PCT Pub. No.: WO2019/158390
PCT Pub. Date: Aug. 22, 2019

(65) Prior Publication Data
US 2021/0014999 A1    Jan. 14, 2021

(30) Foreign Application Priority Data
Feb. 19, 2018  (DE) ............... 10 2018 202 484.7

(51) Int. Cl.
*H05K 7/20*    (2006.01)
*H02M 7/00*    (2006.01)
*H05K 7/14*    (2006.01)

(52) U.S. Cl.
CPC ............ *H05K 7/209* (2013.01); *H02M 7/003* (2013.01); *H05K 7/1432* (2013.01)

(58) Field of Classification Search
None
See application file for complete search history.

(56) References Cited

U.S. PATENT DOCUMENTS 5,497,289 A    3/1996  Sugishima et al.
6,954,368 B1 *  10/2005  Francoeur ............ H02M 7/003
                                                    361/763
(Continued)

FOREIGN PATENT DOCUMENTS

CN    203288587 U    11/2013
DE    89 09 246 U1   11/1989
(Continued)

OTHER PUBLICATIONS

Search Report issued in German Patent Application No. 10 2018 202 484.7 dated Jan. 22, 2019 (14 pages).
(Continued)

*Primary Examiner* — Courtney L Smith
(74) *Attorney, Agent, or Firm* — Crowell & Moring LLP

(57) ABSTRACT

A power electronics assembly comprises a heat sink, at least two half bridge modules mounted on one side of the heat sink, a circuit board mounted on the half bridge modules, and at least one capacitor mounted on the circuit boards, wherein each of the half bridge modules has a housing that has a cold side that is mounted on the heat sink, and the housing has a connection side from which numerous connection pins project for each DC connection in the half bridge module that are connected to the circuit board, and wherein conductors in the circuit board are designed to connect the half bridge modules in parallel and connect them to the at least one capacitor to form a DC link.

20 Claims, 8 Drawing Sheets

(56) References Cited

U.S. PATENT DOCUMENTS

| | | | |
|---|---|---|---|
| 7,375,287 B2 | 5/2008 | Rathmann | |
| 9,088,195 B2 | 7/2015 | Yamasaki et al. | |
| 10,141,247 B2* | 11/2018 | Walter | H01L 25/07 |
| 11,018,117 B2* | 5/2021 | Mohn | H01L 23/5386 |
| 2009/0085219 A1* | 4/2009 | Bayerer | H01L 24/49 |
| | | | 257/776 |
| 2009/0261472 A1* | 10/2009 | Bayerer | H01L 24/06 |
| | | | 257/719 |
| 2010/0328893 A1 | 12/2010 | Higashidani et al. | |
| 2013/0223009 A1 | 8/2013 | Nakatsu et al. | |
| 2014/0003095 A1* | 1/2014 | Thomas | H02M 3/33584 |
| | | | 363/21.04 |
| 2014/0313671 A1 | 10/2014 | Sugita et al. | |
| 2016/0219705 A1* | 7/2016 | Bayerer | H05K 1/145 |
| 2017/0079132 A1* | 3/2017 | Bayerer | H05K 1/0204 |
| 2017/0194878 A1 | 7/2017 | Jones et al. | |
| 2018/0206359 A1* | 7/2018 | McPherson | H02M 3/158 |
| 2018/0226315 A1* | 8/2018 | Gottwald | H01L 23/3121 |

FOREIGN PATENT DOCUMENTS

| | | |
|---|---|---|
| DE | 4 333 387 | 3/1994 |
| DE | 43 05 793 A1 | 9/1994 |
| DE | 10 2007 007 262 A1 | 9/2007 |
| DE | 10 2012 210 677 | 2/2013 |
| DE | 10 2012 222 011 | 6/2014 |
| DE | 10 2018 202 484 A1 | 8/2019 |
| EP | 0 998 019 A1 | 5/2000 |
| EP | 2 254 228 A1 | 11/2010 |
| EP | 3 206 468 | 8/2017 |
| WO | WO 2019/158390 | 8/2019 |

OTHER PUBLICATIONS

Search Report issued in PCT Application No. PCT/EP2019/052708 dated May 16, 2019 (5 pages).

Written Opinion issued in PCT Application No. PCT/EP2019/052708 dated May 16, 2019 (10 pages).

* cited by examiner

POWER ELECTRONICS ASSEMBLY

CROSS-REFERENCE TO RELATED APPLICATIONS

This application is a U.S. national stage application under 35 U.S.C. § 371 of PCT Application No. PCT/EP2019/052708, filed on Feb. 5, 2019, and published as WO 2019/158390 A1 on Aug. 22, 2019, which claims priority from German Application No. 10 2018 202 484.7, filed on Feb. 19, 2018, the entirety of which are each hereby fully incorporated by reference herein.

The invention relates to a power electronics assembly, and a multi-phase power electronics assembly that comprises numerous power electronics assemblies.

Voltage intermediate circuit AC converters, also referred to as inverters, normally comprise numerous half bridges, which are connected in parallel at the DC side to a DC link capacitor. At the AC side, the half bridges can be connected to an electrical machine, to which a multi-phase alternating current can be provided by the inverter.

Half bridge modules, each of which has such a half bridge, can be arranged adjacently on a single cooling plate and electrically connected at the DC side by a monolithic DC link capacitor, for example, to obtain such a power electronics circuit. It is also possible to use a single power module in which numerous half bridges are integrated, instead of numerous half bridge modules, each of which has a half bridge. The combination of the DC link capacitor with a half bridge forms an electrical loop, referred to as a commutation cell. The parasitic inductance in this loop represents the leakage inductance of the commutation cell, or the commutation inductance.

Half bridge modules normally have a housing in which the power semiconductor switches are housed. In typical half bridge modules, the power connectors project from one or more of the narrow sides of the housing. If a DC link capacitor is then place next to a narrow side of the half bridge module and connected there to the power connectors on the DC side, there will normally be a leakage inductance in the commutation circuit in the range of 20-50 nH. While these values are less problematic with inverters formed using silicon semiconductors, these leakage inductances could prevent an optimal exploitation of the electrical properties of newer wide-bandgap semiconductors, such as silicon carbide (SiC), or gallium nitride (GaN). The artificially delayed switching of the wide-bandgap semiconductor necessitated by the leakage inductance normally results in higher switching losses and can thus reduce the potential efficiency of the inverter.

Numerous factors can contribute to the leakage inductance. If, for example, a DC link capacitor with two connectors for each half bridge is used, which is connected at the DC side to the half bridges of the inverter via two contact points (DC positive and DC negative), this bottleneck results in an increased leakage conductivity.

To increase the current carrying capacity, numerous power semiconductors can be connected in parallel within a half bridge module. Depending on the geometry, these individual semiconductors normally cannot be connected to the DC link capacitor with electricity of the same value. This can result in asymmetrical switching procedures, and the semiconductors cannot conduct the theoretically maximum possible load current. These asymmetries may therefore require an oversized power electronics circuit.

To obtain inverters with different current categories, it may be necessary to design half bridge modules for the highest current category that is to be obtained. A lower population of half bridge modules can then result in cost advantages, but no savings with regard to structural space.

One object of the invention is to overcome the problems specified above. Another object of the invention is to provide mechanical structures requiring little structural space for power electronics circuits, which exhibit a low leakage inductance and a high level of symmetry, while still being easy to scale to higher amperages.

These objects are achieved through the subject matter of the independent claims. Further embodiments of the invention can be derived from the dependent claims and the following description.

One aspect of the invention relates to a power electronics assembly. The power electronics assembly can be a module comprising components that are mechanically connected to one another, which result in an inverter with an intermediate circuit. By way of example, the power electronics assembly can be used as an inverter in an electric vehicle. It should be understood that the terms "power electronics" and "power semiconductor" can relate to electrical components that are designed to process amperages of more than 10 A and/or voltages of more than 100 V.

According to one embodiment of the invention, the power electronics assembly comprises a heat sink, at least two half bridge modules mounted on one side of the heat sink, a printed circuit board mounted on the half bridge modules, and at least one capacitor, which is mounted on the circuit board. The heat sink can be a plate and/or contain a hollow space through which a coolant can be pumped. The half bridge modules can also form the hollow space in combination with the heat sink. The heat sink can be made of ceramic.

The half bridge modules can be connected to the heat sink with screws, for example. Other means of attachment can also be used, e.g. rivets or adhesive.

Each of the half bridge modules has a housing in which numerous power semiconductor switches can be connected to form a half bridge. The housing has a cold side, which is mounted on the heat sink, and the housing has a connection side, from which numerous connection pins project. The connection pins can be connected to the half bridges. By way of example, the housings for the half bridge modules can be substantially prismatic and/or made of plastic, e.g. a polymer or ceramic. A substrate can be accommodated in the housing, e.g. DBC (direct bonded copper), with which the power semiconductor switches are electrically connected to one another and/or to the connection pins.

The housing for a half bridge module can also have connection openings or connection bushings, into which two-sided connection pins, such as two-sided press-fit fins, are inserted. The ends of the two-sided connection pins projecting from the housing can then serve as the connection pins for the half bridge modules.

A half bridge can comprise two switches connected in series. The DC connections are formed on the ends of the series connection and an AC connection between the two switches. Each of these switches can be composed of one or more power semiconductor switches connected in parallel, such as transistors or thyristors. The power semiconductor switches can have a silicon substrate or a wide-bandgap substrate, with a GaN or SiC basis.

Numerous connection pins project from the connection sides of the housings for each half bridge module, for each DC connection in the half bridge module, and optionally for the AC connection in the half bridge module. The DC connections can be the DC+ and DC− connections for the half bridges in the half bridge modules. The two DC connections and the AC connection can be regarded as the power connections for the half bridge modules. There can be numerous connection pins for each of the power connections. The housing of a half bridge module can be substantially flat on the cold side. Numerous connection pins for DC+, DC−, and AC can project from the housing on the opposite, connection side. The housing can have numerous connection pins for DC+, DC−, and AC in each case. The connection pins can be press-fit pins, i.e. they can have a plug head, which can clamp into an opening in a spring-loaded manner.

It should be understood that the housing for a half bridge module can also contain other connection pins for control connections, such as for the gates in the power semiconductor switch.

The connection pins are connected to the circuit board. The connection pins can be inserted into the circuit board, which can contain openings for this, which can be press-fit bushings, for example, e.g. bushings with a substantially cylindrical interior wall. If the circuit board is a printed circuit board, or PCB, the openings can pass through the circuit board, e.g. in the form of lands.

The circuit board can also contain other similar openings in which the connection pins of the capacitor(s) are inserted, which in this case can contain connection pins, such as press-fit fins, on a side facing the circuit board.

There are conductors in the circuit board that are designed to connect half bridge modules in parallel, and connect to the at least one capacitor to form a DC link. By way of example, the circuit board can have numerous electrically conductive layers, each of which connect the positive and negative DC connections in the half bridge modules, or their half bridges and the capacitors to one another. The AC connections in the half bridge modules, or their half bridges, can also be connected to one another via the circuit board.

In this manner, an assembly is obtained with half bridge modules connected in parallel, which span a surface in which there are numerous electrical contact points (in particular, contacts for DC+ and DC−) formed by the connection pins and the corresponding openings in the circuit board. These contact points enable a connection of the DC link capacitors distributed over the surface and connected in parallel. The half bridge modules and the capacitor(s) can be parallel to one another and/or overlap one another when seen from the perspective of the cooling surface of the heat sink. The contacts or connection pins in the half bridge modules, and the capacitor(s) can be oriented toward one another.

The half bridge modules connected in parallel can be arranged in a plane. In the same manner, DC link capacitors connected in parallel can be arranged in a plane. The connection pins and/or contact points for the half bridge modules and the capacitor(s) can face one another. A circuit board between them can electrically connect the half bridge modules and the capacitor(s) to one another. From the perspective of the circuit board or the heat sink, the half bridge modules and the capacitor(s) can partially or fully overlap. The numerous contact pins for the power connections that form the electrical connection can be located in the overlapping region.

The connection pins for each power connection of a half bridge module can be distributed over the connection side. This can mean that two connection pins of a power connection are further apart from one another than two connection pins for different power connections.

As a result of this configuration, a lower commutation inductance can be obtained than when the capacitors and the half bridge modules are connected electrically to one another laterally and/or via only a few connections. Furthermore, an optimal, symmetrical arrangement of power semiconductors, DC link capacitors and a control can be obtained. As a result of the compactness of the arrangement, a high power density, higher efficiency, and a high level of flexibility regarding the structural space can be obtained. Furthermore, the arrangement can be scaled easily, because an arbitrary number of half bridge modules can be connected and arranged in parallel.

Because of the low commutation inductance, the properties of the wide-bandgap power semiconductors can be made better use of compared to, e.g., Si power semiconductors with higher switching frequencies.

The power electronics assembly can be regarded as a distributed power electronics assembly, because numerous half bridge modules are distributed on a heat sink, numerous capacitors can be distributed on the circuit board, and the half bridge modules and capacitors can be distributed on different sides of the heat sink.

According to one embodiment of the invention, the power electronics assembly also comprises at least two opposing half bridge modules mounted on opposite sides of the heat sink, an opposing circuit board mounted on the opposing half bridge module, and at least one opposing capacitor, which is mounted on the half bridge module. In other words, the power electronics assembly can be substantially mirror-symmetrical in relation to a central plane of the heat sink. It should be understood that the opposing half bridge modules, the opposing circuit board, and the at least one opposing capacitor are configured, and/or can be electrically and mechanically connected to one another, just like the corresponding components on the other side. As a result, a larger cooling surface can be used when the pressure drop remains constant in the coolant circuit. The thermal resistance of the assembly can be optimized by using both sides of the cooling surface when the pressure drop remains constant.

According to one embodiment of the invention, the circuit boards and the opposing circuit boards are connected with an electrically conductive bridge element, with which an AC connection on the half bridge module on the one side of the heat sink is electrically connected to an AC connection on the half bridge module on the opposite side of the heat sink. The circuit boards mounted on opposite sides of the heat sink can extend over the edges of the heat sink, and contain connections there (such as bushings or soldering eyelets) for the AC connections on the half bridges. The bridge element can be inserted into these connections between the circuit boards. By way of example, the bridge element can have connection pins on the opposite end, which are inserted into these connections.

The bridge element can comprise a metal latch, for example, which is clamped between the circuit boards, or mechanically and electrically connected thereto.

According to one embodiment of the invention, the heat sink has an opening between two half bridge modules, through which an AC connection connected to the circuit board extends to an opposite side of the heat sink. This can result in a particularly symmetrical construction, because the AC connection can be placed spatially between two half bridge modules. The conductors in the circuit board can be arranged symmetrically to the opening. The AC connection can have connection pins on one end, e.g. press-fit pins, which can be inserted into corresponding openings in the circuit board.

According to one embodiment of the invention, the circuit board is formed by a plastic plate coated with metallic surfaces. The circuit board can be a printed circuit board (PCB). The circuit board can also have one or more metallic layers sandwiched between two plastic layers. The metallic layers in the circuit board can be the conductors with which the connection pins in the half bridge modules and the capacitor are connected.

According to one embodiment of the invention, the capacitor has a housing from which the connection pins that are connected to the circuit board project. The connection pins can be plugged into the circuit board, for example. There can be numerous connection pins for each capacitor for the positive and negative connections.

According to one embodiment of the invention, there are at least two capacitors with separate housings mounted on the circuit board. The at least two capacitors can be connected in parallel via the circuit board. The capacitors can have prismatic housings, which are mounted next to one another on the circuit board. The number of capacitors can differ from the number of half bridge modules. By way of example, there can be two capacitors for three half bridge modules.

According to one embodiment of the invention, the circuit board is integrated in a housing for the capacitor, wherein the connection pins for the half bridge module are plugged into the housing for the capacitor. By way of example, the capacitor can be made of numerous individual capacitor components that are soldered to the circuit board. The circuit board and the capacitor components can be integrated in a common housing that has openings through which the connection pins for the half bridge module can be inserted into the openings in the circuit board.

Openings or bushings for the connection pins for the half bridge module can be integrated in the housing for the capacitor, which are connected to one another inside the housing with conductor paths, e.g. from a lead frame. The conductor paths, which can be made of copper, just like the conductors or metallic surfaces and/or layers of a separate circuit board, can be injection molded into a plastic wall of the housing for the capacitor. As a result, the circuit board can form a wall of the housing for the capacitor.

In other words, the capacitor can have press-fit bushings for receiving press-fit pins, in which corresponding press-fit pins on a half bridge can be inserted. In this manner, a corresponding capacitor can be plugged directly onto one or more half bridge modules. This can simplify the production of the power electronics assembly.

According to one embodiment of the invention, the circuit board is mechanically connected directly to the heat sink via spacer bolts. In addition to the direct mechanical connection of the circuit board to the heat sink via the half bridge module, it can also be connected directly to the heat sink, e.g. at its edges and/or corners. By way of example, the spacer bolts can be provided on the heat sink.

A further aspect of the invention relates to a multi-phase power electronics assembly. The power electronics assembly described above can be regarded as a single-phase power electronics assembly when the AC connections on the half bridge module are connected in parallel. The multi-phase power electronics assembly is made up of numerous single-phase power electronics assemblies. In this case, the multi-phase power electronics assembly can form an inverter for the three-phase AC power, such as is used, e.g., in an electric vehicle.

According to one embodiment of the invention, the multi-phase power electronics assembly comprises at least two (single-phase) power electronics assemblies, as described above and below. The single-phase power electronics assemblies are electrically connected to a DC connection, and each provide, with an AC connection, one phase of a multi-phase AC voltage.

According to one embodiment of the invention, the at least two single-phase power electronics assemblies are stacked on top of one another such that at least one capacitor in one power electronics assembly lies opposite at least one capacitor in another power electronics assembly. The power electronics assemblies can be stacked such that their heat sinks are substantially parallel.

According to one embodiment of the invention, the at least two single-phase power electronics assemblies are placed next to each other such that the at least one capacitor and the circuit board in one power electronics assembly are placed next to the at least one capacitor and the circuit board in another power electronics assembly. In this case, the heat sinks can be placed next to and flush with one another. The power electronics assemblies can also share a common heat sink, or the heat sinks for the at least two power electronics assemblies can be provided by a single, shared heat sink.

The half bridge modules can be placed on both sides of the shared heat sink. In this manner, a large cooling surface can be made use of when the pressure drop remains constant in the coolant circuit.

According to one embodiment of the invention, at least three single-phase power electronics assemblies are arranged in a star, such that DC connections in the power electronics assemblies face a common DC connection region, in which they are electrically connected to one another with a common busbar. The shared busbar can have two substantially parallel electrically conductive plates that are orthogonal to an axis of symmetry for the star-shaped arrangement.

In this manner, the phases of an inverter can be arranged around a common DC+ and DC− current distribution point, or a current distribution area, which can be triangular. The electrically conductive plates specified above can form the current distribution area. The DC connection region can evenly distribute the overall DC amperage to the three single-phase power electronics assemblies.

In this manner, it is possible to obtain the shortest possible pathways, of the same lengths, to the individual single-phase power electronics assemblies. The DC connection region can be used as a direct power supply point, or a connection from a battery. Furthermore, the AC connections of the single-phase power electronics assemblies lying opposite the DC connection region can be connected directly to the phases of an electric motor when the DC connection region and/or the axis of symmetry for the single-phase power electronics assemblies arranged in a star is aligned with an axis of the electric motor.

Exemplary embodiments of the invention shall be described in greater detail below with reference to the attached drawings.

Therein:

The reference symbols used in the figures and their references are listed below in the list of reference symbols. Fundamentally, identical or similar parts have the same reference symbols.

Figure 1:
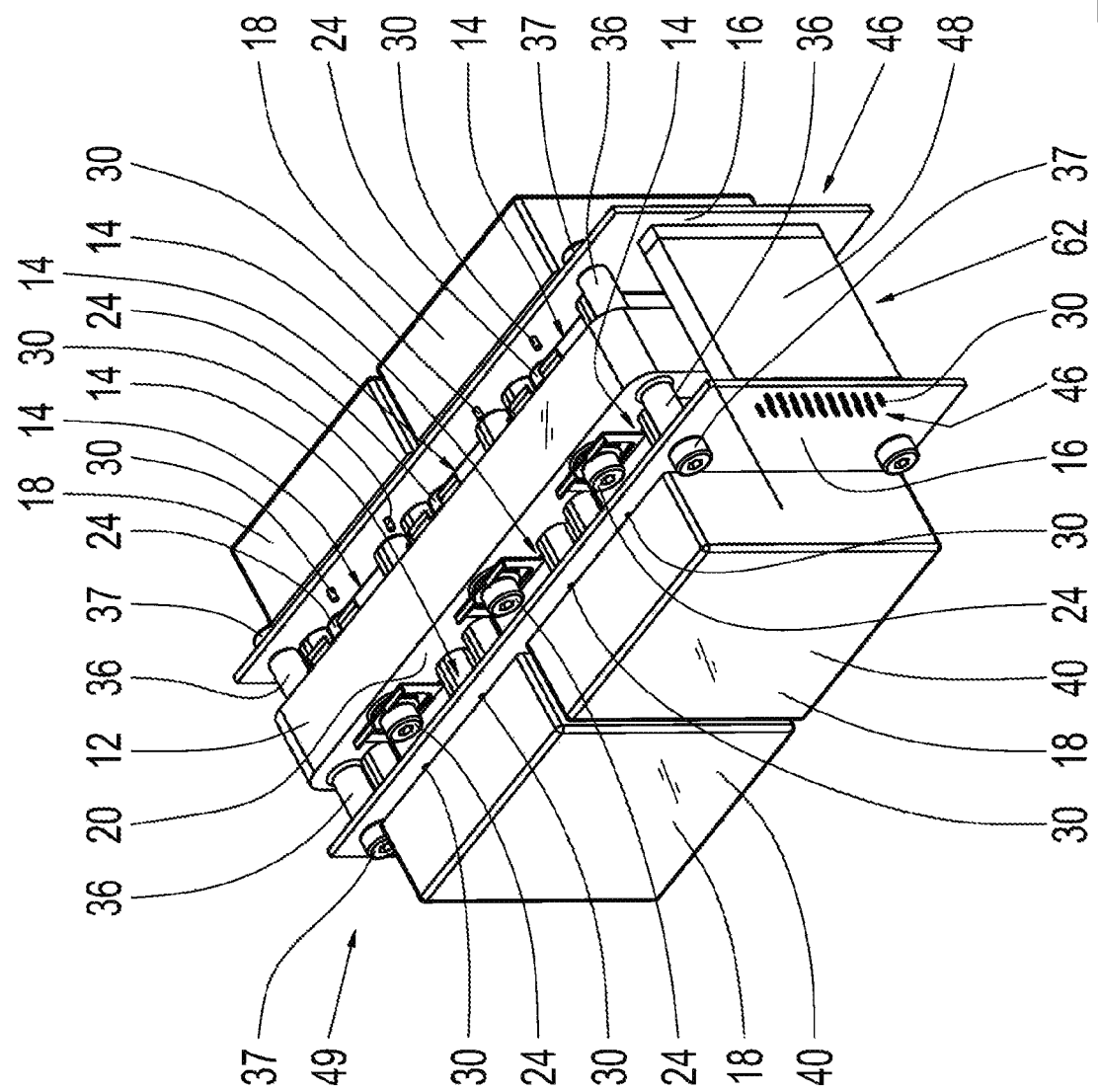
FIG. 1 shows a perspective view of a power electronics assembly according to an embodiment of the invention.
Figure 2:
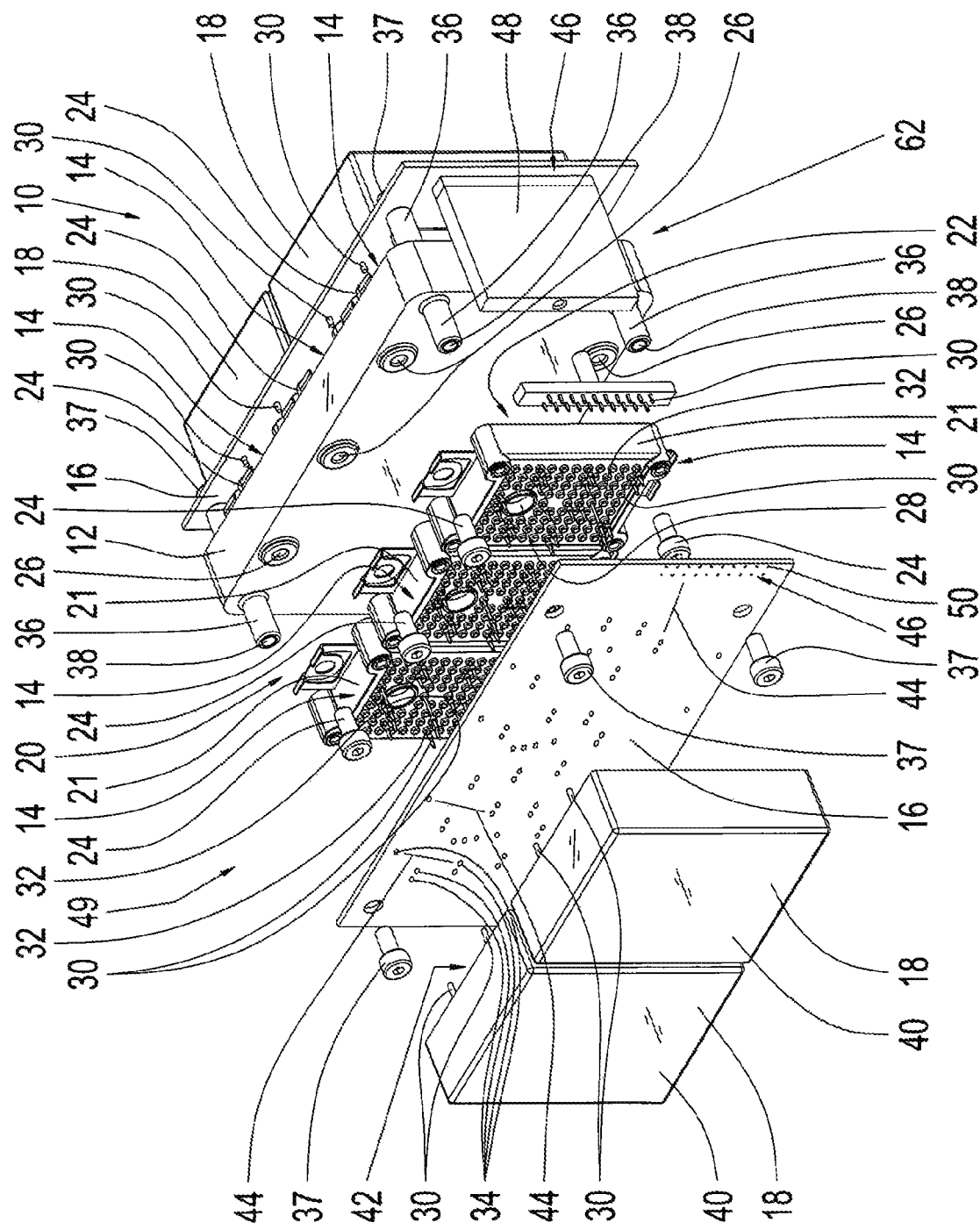
FIG. 2 shows an exploded view of the power electronics assembly shown in FIG. 1.

FIGS. 1 and 2 show a power electronics assembly 10 that comprises a heat sink 12, half bridge modules 14 mounted on both sides, or cooling surfaces 20 of the heat sink 12, circuit boards 16 mounted on the half bridge modules 14, and capacitors 18 mounted thereon.

It should be understood that it is also possible to form a power electronics assembly 10 in which half bridge modules 14, a circuit board and one or more capacitors 18 are mounted on only one side of the heat sink 12.

The plate-shaped heat sink 12, which has a basically rectangular shape, has two flat cooling surfaces 20 to which the half bridge modules 14 are attached at a cold side 22. The attachment can be made via screws 24, which are screwed into openings 26 in the heat sink 12. Other means of attachment are also possible. The heat sink 12 can be made of ceramic and/or it can be suitable for liquid cooling.

There are three half bridge modules 14 mounted in each case on one or both sides or cooling surfaces 20 of the heat sink 12. The half bridge modules 14 have substantially prismatic housings 21 made of plastic, which have numerous connection pins 30 on a connection side 28 lying opposite the cold side 22. The half bridge modules 14 on one side of the heat sink 12 can be arranged in a plane that can run substantially parallel to the heat sink 12 and/or the circuit board 16.

As shown in the figures, the connection pins 30 can be double-sided pins that are inserted into connection bushings 32 in the housings 21 for the half bridge modules 14. The connection pins 30 can be designed as press-fit pins at one or both ends. The connection pins 30 can also be permanently integrated in the housings for the half bridge modules 14.

The connection pins 30 form connections for DC+ (positive DC voltage), DC− (negative DC voltage), and AC (AC voltage). There are numerous connection pins 30 for each type of connection (DC+, DC−, AC). There can also be connection pins 30 for control connections, such as for gate signals and/or sensor signals.

Each of the half bridge modules 14 comprises two power semiconductor switches connected in series between DC+ and DC−, between which the AC connection is provided.

Each of the circuit boards 16 has openings 34 in which the connection pins 30 are inserted. In addition, the circuit boards 16 are mounted directly on the heat sink 12 via spacer bolts 36 integrated in the heat sink 12. The attachment can be obtained via screws 37 that are screwed into openings 38 in the spacer bolts. Other means of attachment are also possible.

There are two capacitors 18 on each side of the power electronics assembly 10, which have substantially prismatic housings 40, which have connection pins 30 on a connection side 42, which are plugged into openings 34 of the respective circuit boards 16. These connection pins 30 can also be press-fit pins. There can be numerous connection pins for both DC+ and DC−. The capacitors 18 on one side of the heat sink 12 can be arranged in a plane that can run substantially parallel to the heat sink 12 and/or the circuit board 16.

The capacitors 18 can be connected in parallel via the circuit board 16, and connected to the DC+ and DC− connections in the half bridge modules 14. In this manner, a DC link is formed by the capacitors 18, from which the half bridge module can generate an AC voltage (and vice versa) when activated accordingly.

There are also electrical conductors 44 in each circuit board 16, which are only shown schematically in FIG. 2. By way of example, the conductors 44 can be provided by metal layers in the circuit board 16. The circuit board 16 can be designed, e.g., as a plastic plate with metallic surfaces applied thereto.

Further conductors 44 in the circuit boards 16 connect the AC connections to the half bridges in the half bridge modules 14 to an AC connection 46, via which the two circuit boards are electrically connected to a bridge element 48. The circuit board 16 can have numerous openings or bushings 50 forming the AC connection, and the bridge element can have numerous connection pins 30 on its end that are inserted into the openings 50. These connection pins 30 can also be press-fit pins.

The bridge element 48, which can comprise a metal latch, and/or can have numerous parts, can serve as an AC connection 47 for the power electronics assembly 10. The DC connections 49 in the power electronics assembly 10 can be on the opposite side of the circuit board 16.

Figure 3:
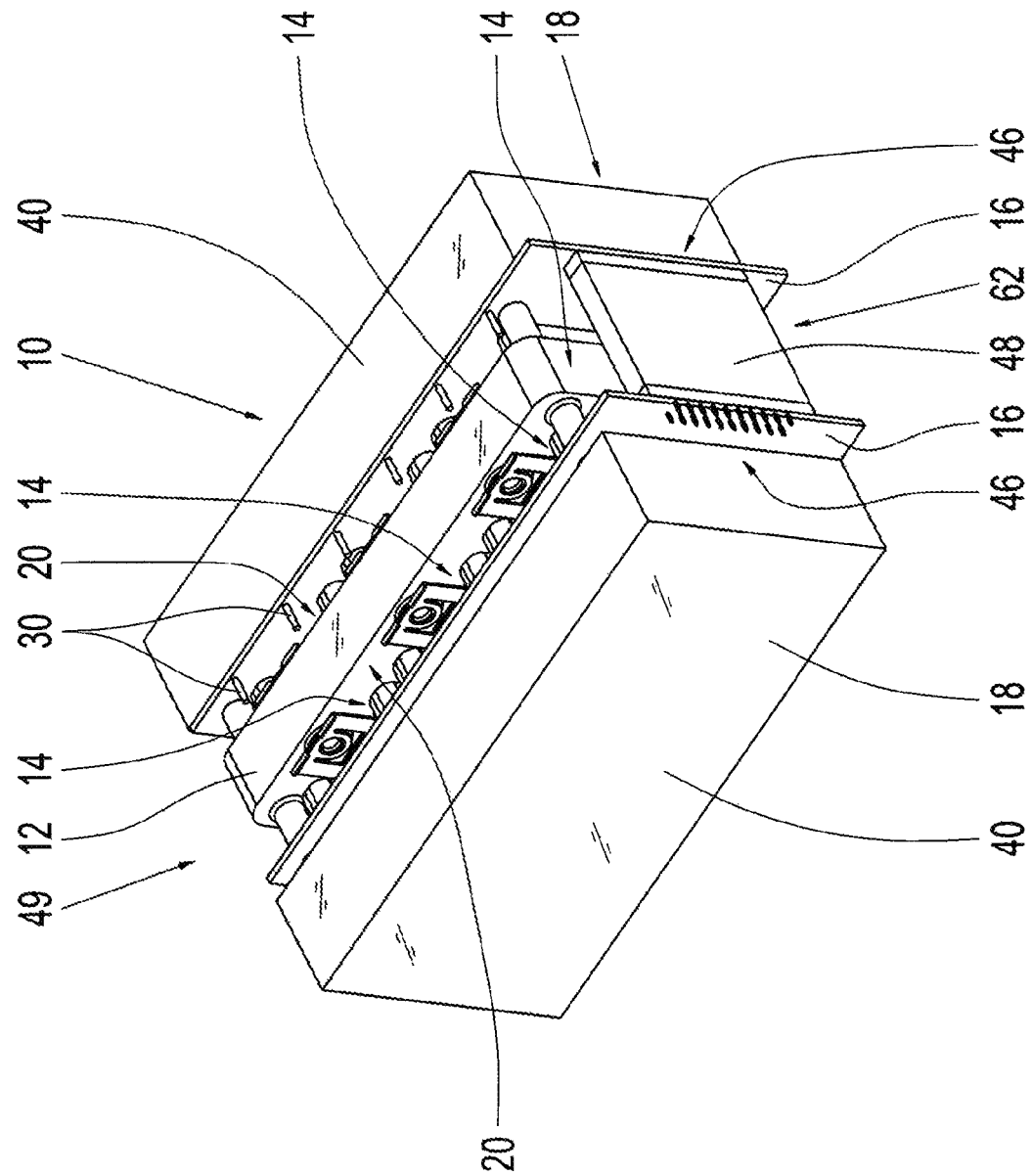
FIG. 3 shows a perspective view of a power electronics assembly according to an embodiment of the invention.

FIG. 3 shows another embodiment of a power electronics assembly 10, which is exactly the same as that shown in FIGS. 1 and 2, aside from the following differences.

There is only one capacitor 18 on each side of the heat sink 12 in FIG. 3. It should be understood that a capacitor 18 is a module with just one housing 40, in which the connection pins 30 are located. There can be numerous capacitor components in this housing 40. On the whole, capacitors 18 on each side of the heat sink, containing numerous half bridge modules 14, are connected in parallel via the circuit board 16.

FIG. 3 also shows that the bridge element 48 for connecting the AC connections 46 in the circuit boards 16 can be formed as an integral unit.

Figure 4:
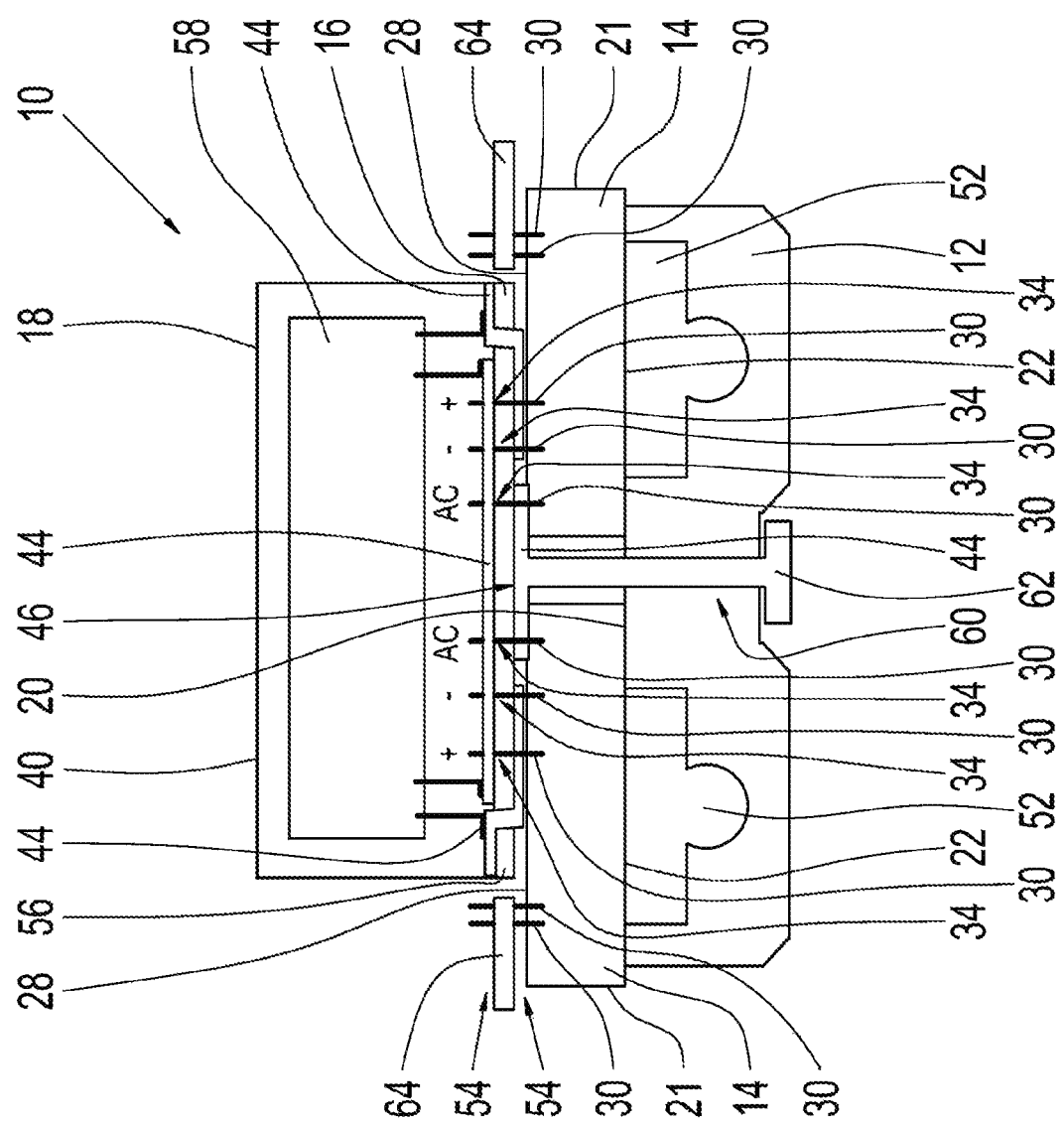
FIG. 4 shows a schematic cutaway view of a power electronics assembly according to an embodiment of the invention.

FIG. 4 shows another embodiment of a power electronics assembly 10, in which the half bridge modules 14, the circuit boards 16, and the capacitor 18 are placed on just one side of the heat sink 12.

The half bridge modules 14 are mounted in a plane on the cooling surface 20 of the heat sink 12. The heat sink 12 has a hollow space 52 through which a liquid can flow for liquid cooling. The half bridge modules 14 close off this hollow space 52 against the environment with their cold sides 22. The hollow space 52 (aside from the coolant connections) can also be closed off from the environment by the material of the heat sink 12.

The heat sinks 12 in the embodiments shown in FIGS. 1 to 3 can be constructed like the heat sink in FIG. 4. Furthermore, the attachment of the half bridge modules 14 in FIG. 4 can be obtained in the same manner as in FIGS. 1 to 3.

The circuit boards 16 and/or the half bridge modules 14, together with the connection pins 30, can be designed in FIG. 4 in the same manner as those in FIGS. 1 to 3, and vice versa. It should be understood that there may be numerous connection pins 30 for each of the potentials DC+, DC−, and AC.

It is shown in FIG. 4 that the conductors 44 can be metallic layers 54 on both sides of a plastic layer 56. The metallic layers 54 can be structured to form the conductors 44. It should be understood that the connection pins are each connected to just one of the metallic layers 54. Parts of the metallic layers 54 for different conductors can overlap. The openings or bushings 34 in the circuit board 16 can be lined with metal, which is connected to one of the two metallic layers 54.

It is also shown in FIG. 4 that the circuit boards 16 and the capacitors 18 can be integrated in a module. One or more capacitor components 58 are attached to the circuit boards 16, e.g. soldered, and enclosed in a housing 40, the undersurface of which is formed by the circuit board.

In FIG. 4, the heat sink has a through hole 60 between the half bridge modules 14 (which is not connected to the hollow space 52 for exchanging liquid), through which an AC connection 62 for the power electronics assembly 10 is inserted. The AC connection 46 in the circuit board 16 is located between the half bridge modules 14 and is electrically connected to the AC connection 62, e.g. via numerous connection pins 30, as is shown in FIGS. 1 and 2.

The half bridge modules 14 are axially symmetrical about the shared AC connection 46, 62. The capacitor 18 spans the AC connection 46, 62. In general, the capacitor 18 can be above or next to the AC connection 46, 62. This results in a symmetrical structure of the commutation cell.

Other circuit boards 64 are shown in FIG. 4, which can be connected to connection pins 30 in the half bridge modules 14 in exactly the same manner as the circuit board 16. These circuit boards 64 contain drives for controlling the semiconductor switches in the half bridge modules 14.

The power electronics assemblies 10 shown in FIGS. 1 to 4 can be regarded as single-phase power electronics assemblies 10, because a phase of an AC voltage can be provided at its AC connection 62. Multi-phase power electronics assemblies 66 shall be described below, which can be constructed from the single-phase power electronics assemblies 10.

The multi-phase power electronics assemblies 66 shown in FIGS. 5 to 9 comprise at least two, and in particular three, single-phase power electronics assemblies 10, which are electrically connected to their DC connections 49 and, with an AC connection 62, each provide a phase. The DC connection 49 can be connected, e.g., to a battery. The AC connections 62 can be connected to an electric motor.

Figure 5:
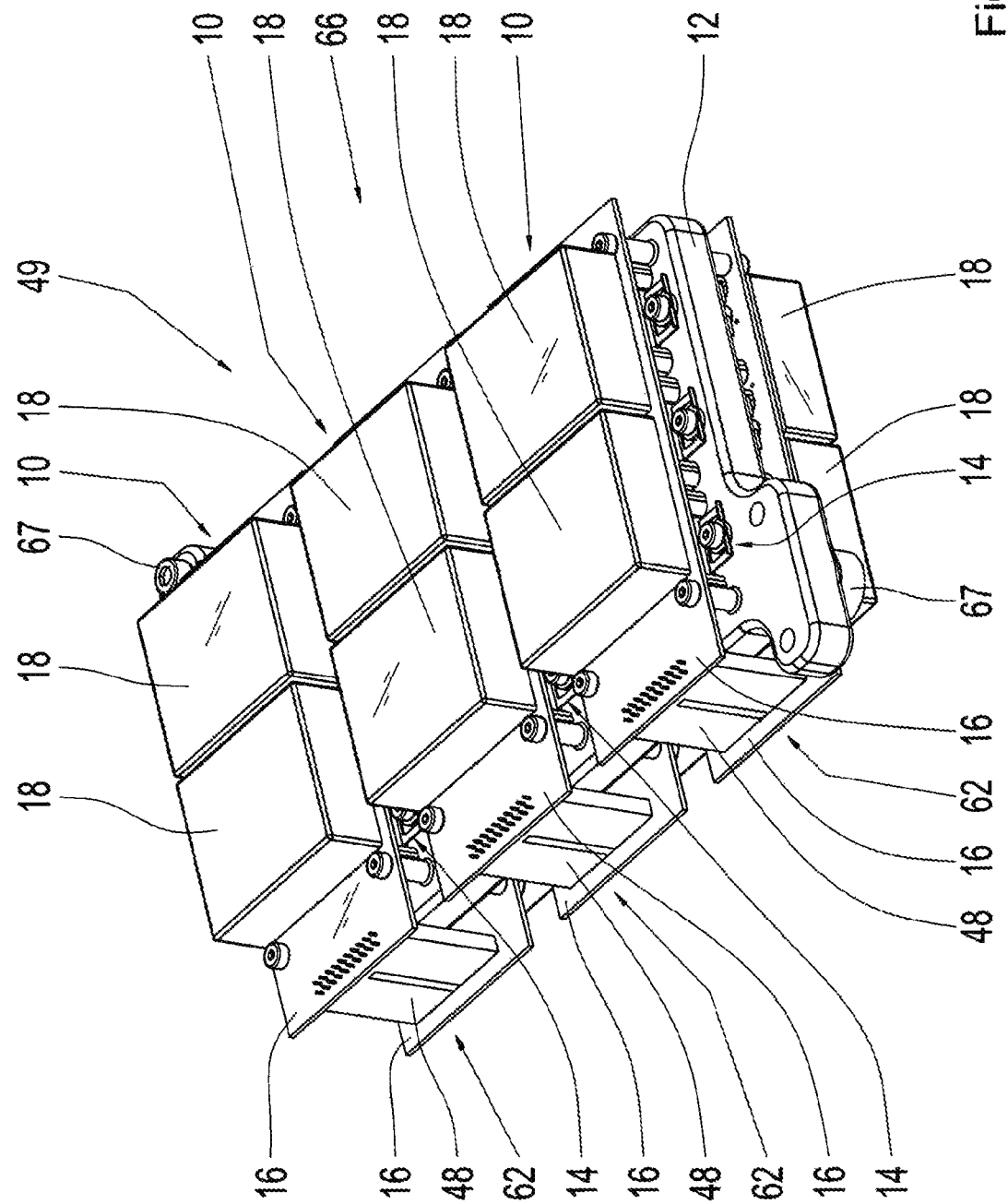
FIG. 5 shows a perspective view of a multi-phase power electronics assembly according to an embodiment of the invention.

In the multi-phase power electronics assembly 66 shown in FIG. 5, three power electronics assemblies 10 are arranged adjacently, as shown in FIGS. 1 and 2, such that the capacitors 18, the circuit board 16, and the half bridge modules 14 in the power electronics assemblies 10 are arranged in a plane on one side of the heat sink.

FIG. 5 also shows that in this case, the heat sinks 12 in the single-phase power electronics assemblies 10 can be formed by a single, shared heat sink 12. The shared heat sink 12, in the form of a plate and/or providing flat cooling surfaces, can simultaneously cool all of the single-phase power electronics assemblies 10 via just two coolant connections 67.

Figure 6:
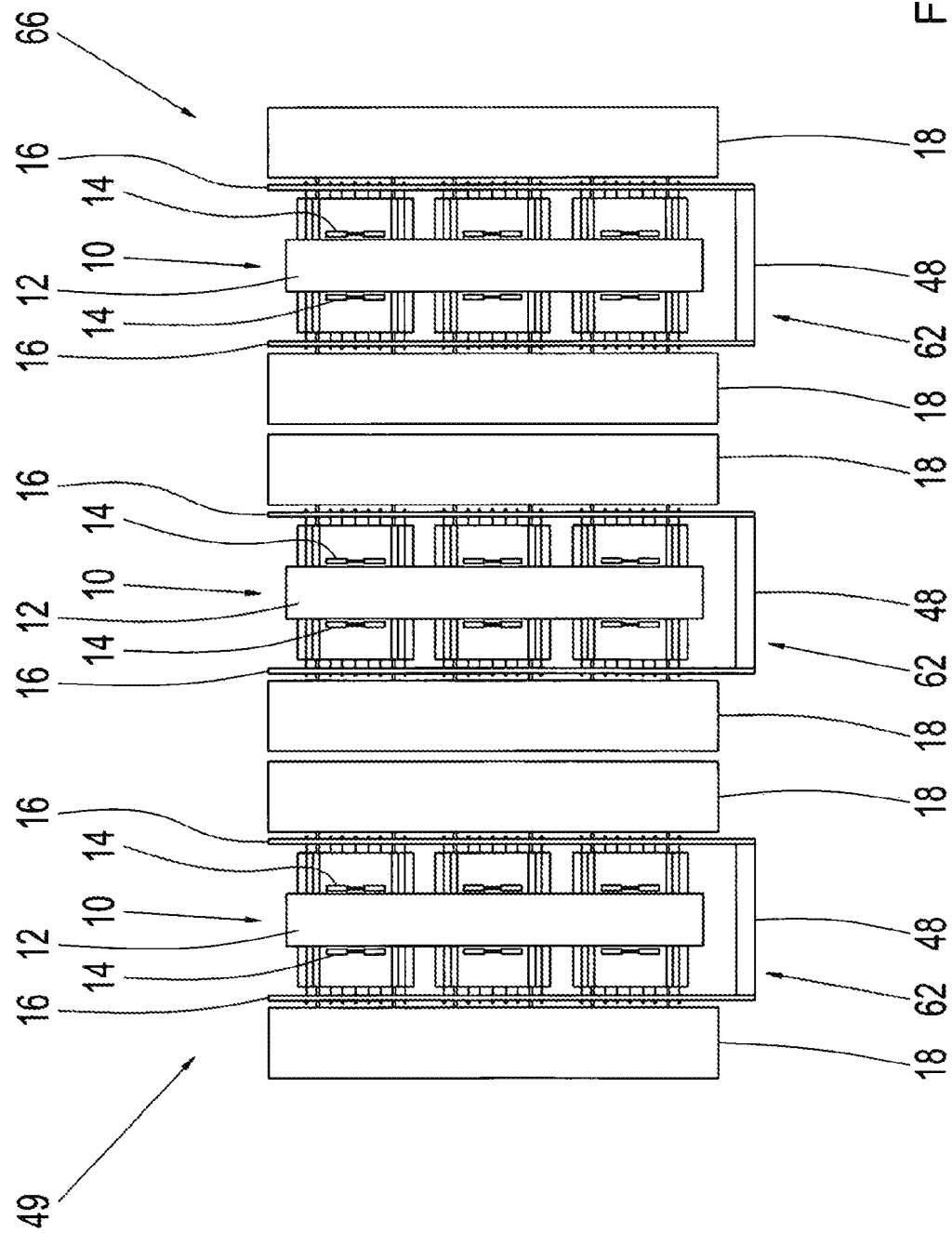
FIG. 6 shows a top view of a multi-phase power electronics assembly according to an embodiment of the invention.

While the single-phase power electronics assemblies 10 are stacked in a direction parallel to the plane of extension for the heat sink 12 and/or the circuit boards 16 in FIG. 5, the multi-phase power electronics assembly 66 in FIG. 6 illustrates that the single-phase power electronics assemblies 10 are stacked such that at least one capacitor 18 in a power electronics assembly 10 lies opposite at least one capacitor 18 in another power electronics assembly 10.

In FIG. 6, the single-phase power electronics assemblies 10 are stacked in a direction orthogonal to the plane of extension for the heat sink 12 and/or the circuit boards 16.

Figure 7:
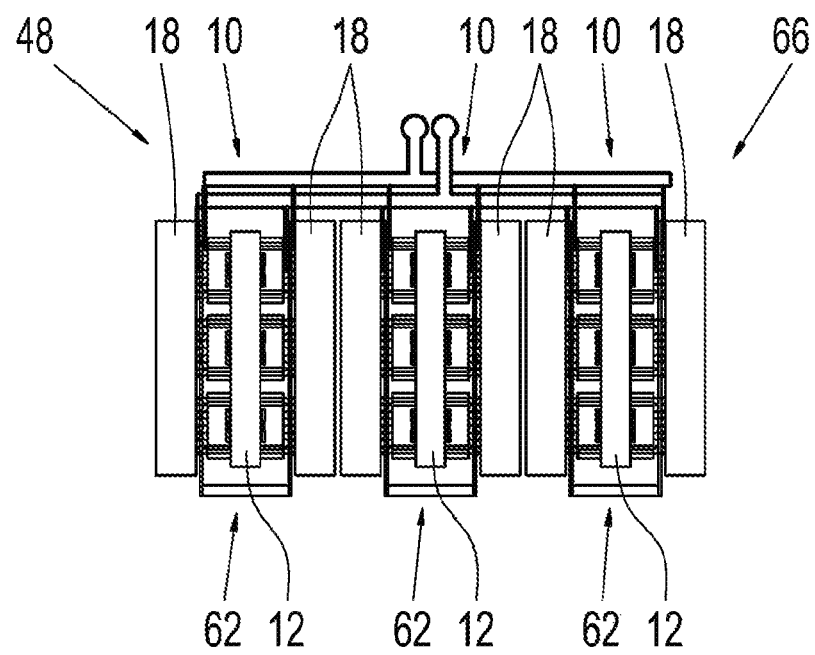
FIG. 7 shows a top view of a multi-phase power electronics assembly according to an embodiment of the invention.

FIG. 7 shows how the DC connections 49 are interconnected on one side of the single-phase power electronics assemblies 10 by a parallel connection to a DC connection for the multi-phase power electronics assembly 66 shown in FIG. 6. As a result, the power electronics assembly 66 provides (in this case three) AC connections 62 on one side, and a DC connection 49 on the opposite side.

Figure 8:
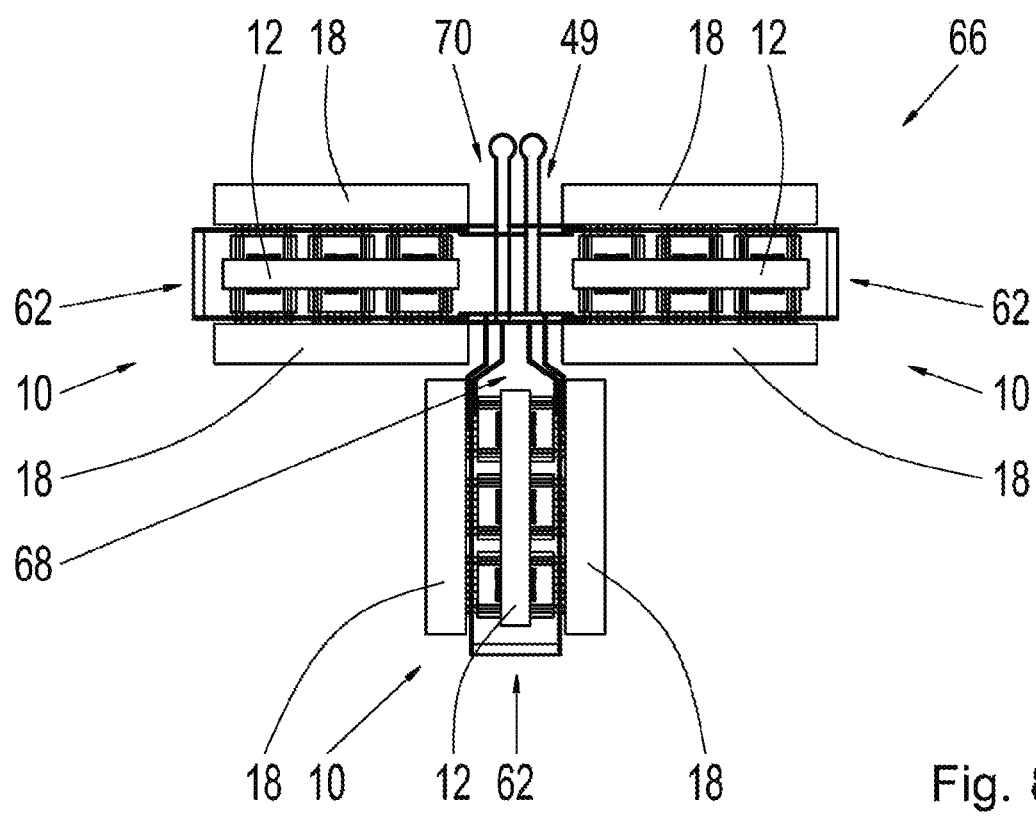
FIG. 8 shows a top view of a multi-phase power electronics assembly according to an embodiment of the invention.
Figure 9:
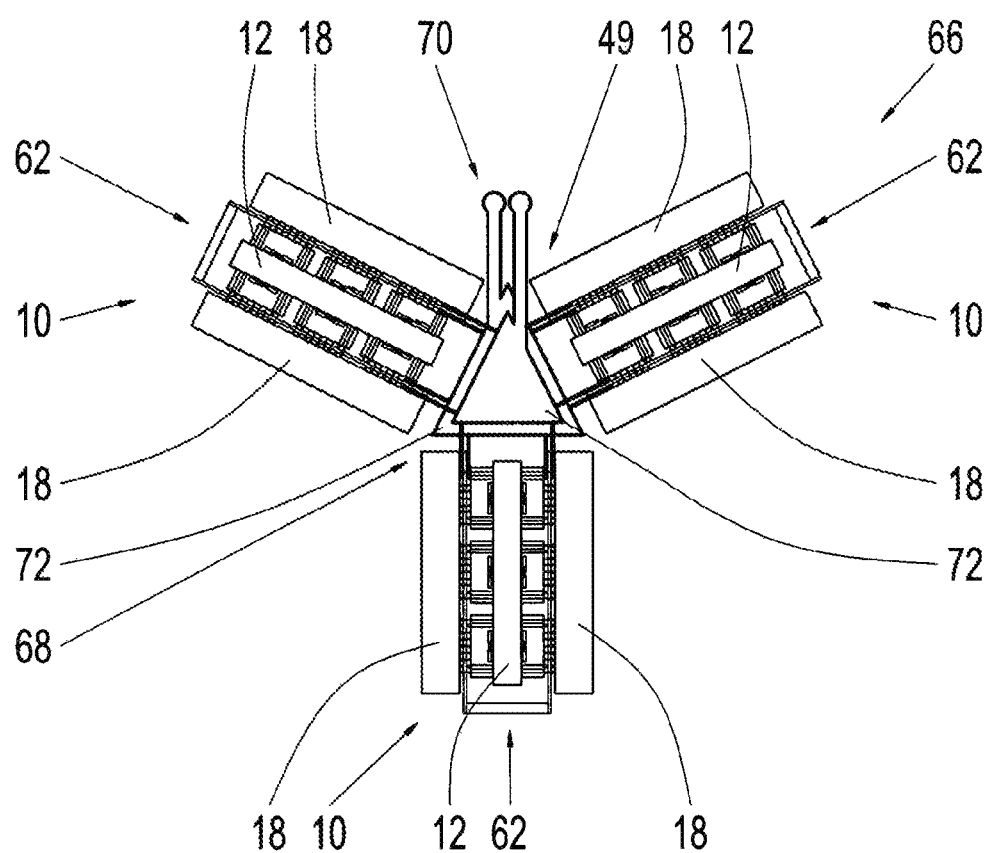
FIG. 9 shows a top view of a multi-phase power electronics assembly according to an embodiment of the invention.

In the multi-phase power electronics assemblies 66 in FIGS. 8 and 9, the DC connections 49 in the single-phase power electronics assemblies 10 are connected in parallel, analogous to FIG. 7. The three power electronics assemblies 10 are arranged in a star, however, such that the DC connections 49 in the power electronics assemblies 10 face a common DC connection region 68, in that they are electrically connected to one another with a shared busbar 70. This results in a symmetrical current, as is the case in FIG. 7.

In FIG. 8, it is shown that two single-phase power electronics assemblies 10 can be arranged substantially parallel to one another, while a third single-phase power electronics assembly 10 is orthogonal thereto, and points with its single-phase power electronics assembly 10 between the two other single-phase power electronics assemblies 10.

In FIG. 9, the three single-phase power electronics assemblies 10 are axially symmetrical to an axis through the connection region 68. Two parallel electrically conductive plates 72 can also be placed in the connection region 68, which are orthogonal to the axis.

The multi-phase power electronics assemblies 66 in FIGS. 8 and 9 can be readily integrated as inverters in a circular housing, which is directly adjacent to an electrical machine, for example, and is flush with the housing for the electrical machine. Such a multi-phase power electronics assembly 66 can also be integrated with an electrical machine directly in a shared machine housing.

It should also be noted that "comprising" does not exclude any other elements or steps, and "one" or "an" does not exclude a plurality. It should furthermore be noted that features or steps described in reference to one of the above exemplary embodiments can also be used in combination with other features or steps of other exemplary embodiments described above. Reference symbols in the claims are not to be regarded as limitations.

REFERENCE SYMBOLS 10 single-phase power electronics assembly
12 heat sink
14 half bridge module
16 circuit board
18 capacitor
20 cooling surface
21 housing
22 cold side
24 screw
26 opening
28 connection side
30 connection pin
32 connection bushing
34 opening
36 spacer bolt
38 openings 40 housing
42 connection side
44 electrical conductor
46 AC voltage connection circuit board
48 bridge element
49 DC voltage connection power electronics assembly
50 opening
52 hollow space
54 metallic layer
56 plastic layer/plastic plate
58 capacitor element
60 through hole
62 AC voltage connection power electronics assembly
64 drive circuit board
66 multi-phase power electronics assembly
68 DC connection region
70 busbar
72 electrically conductive plate

The invention claimed is:

1. A power electronics assembly, comprising:
a heat sink;
at least two half bridge modules mounted on a first side of the heat sink;
a circuit board mounted on the at least two half bridge modules; and
at least one capacitor mounted on the circuit board;
wherein each of the at least two half bridge modules has a housing that has a cold side mounted on the heat sink, and the housing has a connection side, from which numerous connection pins project for each DC connection in the half bridge module that are connected to the circuit board;
wherein conductors in the circuit board are configured to connect the half bridge modules in parallel, and connect them to the at least one capacitor to form a DC link; and
wherein the power electronics assembly further comprises:
at least two opposing half bridge modules mounted on a second side of the heat sink opposite the first side of the heat sink;
an opposing circuit board mounted on the at least two opposing half bridge modules; and
at least one opposing capacitor mounted on the at least two opposing half bridge modules.

2. The power electronics assembly according to claim 1, wherein the circuit board and the opposing circuit board are connected with a bridge element with which an AC connection in at least one of the at least two half bridge modules on the first side of the heat sink is electrically connected to an AC connection in at least one of the at least two opposing half bridge modules on the second side of the heat sink; and
wherein the bridge element comprises a metal latch.

3. The power electronics assembly according to claim 1, wherein the heat sink has an opening between the at least two half bridge modules, through which an AC connection that is connected to the circuit board passes to a second side of the heat sink opposite the first side of the heat sink.

4. The power electronics assembly according to claim 1, wherein the circuit board is formed by a plastic plate with metallic layers thereon.

5. The power electronics assembly according to claim 1, wherein the at least one capacitor has a housing from which connection pins project that are connected to the circuit board.

6. The power electronics assembly according to claim 1, wherein at least two capacitors with separate housings are mounted on the circuit board, and the at least two capacitors are connected in parallel via the circuit board.

7. The power electronics assembly according to claim 1, wherein the circuit board is integrated in a housing for the at least one capacitor; and
wherein the connection pins of the at least two half bridge modules are inserted in the housing for the at least one capacitor.

8. The power electronics assembly according to claim 1, wherein the circuit board is mechanically connected directly to the heat sink via spacer bolts.

9. A multi-phase power electronics assembly, comprising:
at least two power electronics assemblies according to claim 1, each of which are electrically connected to a DC connection and each of which provide a phase of an AC connection.

10. The multi-phase power electronics assembly according to claim 9,
wherein the at least two power electronics assemblies are stacked such that the at least one capacitor in one power electronics assembly lies opposite to the at least one capacitor in another power electronics assembly.

11. The multi-phase power electronics assembly according to claim 9,
wherein the at least two power electronics assemblies are adjacent to one another, such that the at least one capacitor and the circuit board in one power electronics assembly are adjacent to the at least one capacitor and the circuit board in another power electronics assembly; and
wherein the at least two power electronic assembles each comprises respective heat sinks that are formed by at least a single shared heat sink that extends at least between the at least two power electronics assemblies.

12. The multi-phase power electronics assembly according to claim 9,
wherein at least three power electronics assemblies are arranged in a star, such that the DC connections in the power electronics assemblies face a shared DC connection region and are electrically connected to a common busbar.

13. A power electronics assembly, comprising:
a heat sink;
at least two half bridge modules mounted on a first side of the heat sink;
a circuit board mounted on the at least two half bridge modules; and
at least one capacitor mounted on the circuit board;
wherein each of the at least two half bridge modules has a housing that has a cold side mounted on the heat sink, and the housing has a connection side, from which numerous connection pins project for each DC connection in the half bridge module that are connected to the circuit board;
wherein conductors in the circuit board are configured to connect the half bridge modules in parallel, and connect them to the at least one capacitor to form a DC link; and
wherein the heat sink has an opening between the at least two half bridge modules, through which an AC connection that is connected to the circuit board passes to a second side of the heat sink opposite the first side of the heat sink.

14. The power electronics assembly according to claim 13,
wherein the at least one capacitor has a housing from which connection pins project that are connected to the circuit board.

15. The power electronics assembly according to claim 13,
wherein the circuit board is integrated in a housing for the at least one capacitor; and
wherein the connection pins of the at least two half bridge modules are inserted in the housing for the at least one capacitor.

16. A multi-phase power electronics assembly, comprising:
at least three power electronics assemblies according to claim 13, each of which are electrically connected to a DC connection and each of which provide a phase of an AC connection;
wherein the at least three power electronics assemblies are arranged in a star, such that the DC connections in the power electronics assemblies face a shared DC connection region and are electrically connected to a common busbar.

17. A power electronics assembly, comprising:
a heat sink;
at least two half bridge modules mounted on a first side of the heat sink;
a circuit board mounted on the at least two half bridge modules; and
at least one capacitor mounted on the circuit board;
wherein each of the at least two half bridge modules has a housing that has a cold side mounted on the heat sink, and the housing has a connection side, from which numerous connection pins project for each DC connection in the half bridge module that are connected to the circuit board;
wherein conductors in the circuit board are configured to connect the half bridge modules in parallel, and connect them to the at least one capacitor to form a DC link;
wherein the circuit board is integrated in a housing for the at least one capacitor; and
wherein the connection pins of the at least two half bridge modules are inserted in the housing for the at least one capacitor.

18. The power electronics assembly according to claim 17,
wherein the at least one capacitor has a housing from which connection pins project that are connected to the circuit board.

19. The power electronics assembly according to claim 17,
wherein at least two capacitors with separate housings are mounted on the circuit board, and the at least two capacitors are connected in parallel via the circuit board.

20. A multi-phase power electronics assembly, comprising:
at least three power electronics assemblies according to claim 17, each of which are electrically connected to a DC connection and each of which provide a phase of an AC connection;
wherein the at least three power electronics assemblies are arranged in a star, such that the DC connections in the power electronics assemblies face a shared DC connection region and are electrically connected to a common busbar.

* * * * *